(12) United States Patent
Kamei

(10) Patent No.: US 8,093,605 B2
(45) Date of Patent: Jan. 10, 2012

(54) GALLIUM NITRIDE-BASED COMPOUND SEMICONDUCTOR LIGHT-EMITTING DEVICE WITH AN ELECTRODE COVERED BY AN OVER-COATING LAYER

(75) Inventor: Koji Kamei, Ichihara (JP)

(73) Assignee: Showa Denko K.K., Tokyo (JP)

( * ) Notice: Subject to any disclaimer, the term of this patent is extended or adjusted under 35 U.S.C. 154(b) by 832 days.

(21) Appl. No.: 11/997,624

(22) PCT Filed: Jul. 27, 2006

(86) PCT No.: PCT/JP2006/315362
§ 371 (c)(1),
(2), (4) Date: Feb. 1, 2008

(87) PCT Pub. No.: WO2007/015537
PCT Pub. Date: Feb. 8, 2007

(65) Prior Publication Data
US 2010/0102326 A1    Apr. 29, 2010

Related U.S. Application Data

(60) Provisional application No. 60/707,969, filed on Aug. 15, 2005.

(30) Foreign Application Priority Data

Aug. 4, 2005    (JP) ................................ 2005-227164

(51) Int. Cl.
*H01L 33/00*    (2010.01)
(52) U.S. Cl. .............. 257/98; 257/94; 257/99; 257/103; 257/E33.062; 257/E33.063; 257/E33.065

(58) Field of Classification Search .................... 257/94, 257/98, 99, E33.062, E33.063, E33.065, 257/103
See application file for complete search history.

(56) References Cited

U.S. PATENT DOCUMENTS 6,268,618 B1 *  7/2001  Miki et al. ..................... 257/99
(Continued)

FOREIGN PATENT DOCUMENTS

JP    4-088684 A    3/1992
(Continued)

OTHER PUBLICATIONS

European Search Report dated Apr. 29, 2011 for European Patent Application No. 06782222.1.

*Primary Examiner* — Jay C Kim
(74) *Attorney, Agent, or Firm* — Sughrue Mion, PLLC

(57) ABSTRACT

A gallium nitride-based compound semiconductor light-emitting device includes an n-type semiconductor layer, a light-emitting layer and a p-type semiconductor layer of gallium nitride-based compound semiconductors which are formed in this order on a substrate, the negative electrode and the positive electrode being provided in contact with the n-type semiconductor layer and the p-type semiconductor layer, respectively. The positive electrode includes a first electrode and an over-coating layer covering the side surfaces and upper surface of the first electrode, and the area where the over-coating layer comes into contact with the p-type semiconductor layer is greater at the corner portions of the positive electrode than at the side portions thereof, per unit length of the outer edge of the first electrode.

7 Claims, 7 Drawing Sheets

U.S. PATENT DOCUMENTS

| | | |
|---|---|---|
| 6,445,007 B1 * | 9/2002 | Wu et al. .................... 257/80 |
| 6,639,316 B1 | 10/2003 | Toyosaki et al. |
| 6,777,805 B2 * | 8/2004 | Uemura et al. ............ 257/745 |
| 6,794,690 B2 | 9/2004 | Uemura |
| 2002/0047128 A1 | 4/2002 | Song et al. |
| 2003/0006422 A1 | 1/2003 | Miki et al. |
| 2005/0040423 A1 | 2/2005 | Okazaki et al. |

FOREIGN PATENT DOCUMENTS

| | | |
|---|---|---|
| JP | 8-56017 A | 2/1996 |
| JP | 11-220171 A | 8/1999 |
| JP | 2003-168823 A | 6/2003 |
| JP | 2004-363621 A | 12/2004 |
| KR | 2002-0018940 A | 3/2002 |
| WO | 2006/001462 A1 | 1/2006 |

* cited by examiner

GALLIUM NITRIDE-BASED COMPOUND SEMICONDUCTOR LIGHT-EMITTING DEVICE WITH AN ELECTRODE COVERED BY AN OVER-COATING LAYER

CROSS REFERENCE TO RELATED APPLICATION

This application is an application filed under 35 U.S.C. §111(a) claiming benefit, pursuant to 35 U.S.C. §119(e)(1), of the filing date of Provisional Application No. 60/707,969 filed on Aug. 15, 2005, pursuant to 35 U.S.C. §111(b).

TECHNICAL FIELD

The present invention relates to a gallium nitride-based compound semiconductor light-emitting device and, more particularly, to a gallium nitride-based compound semiconductor light-emitting device equipped with a positive electrode having particularly excellent properties and productivity.

BACKGROUND ART

In recent years, gallium nitride-based compound semiconductors, with the compound expressed by $Al_xIn_yGa_{1-x-y}N$ ($0 \leq x < 1$, $0 \leq y < 1$, $x+y<1$), are drawing attention as materials for light-emitting diodes (LEDs) that emit light in the region from ultraviolet to blue or green. Use of compound semiconductors of the above material makes it possible to emit ultraviolet or blue and green light while maintaining a high light-emitting intensity which could not be accomplished before. The gallium nitride-based compound semiconductor is, usually, grown on a sapphire substrate, which is an insulating substrate, and this makes it difficult to provide an electrode on the back surface of the substrate, unlike a GaAs light-emitting device. Therefore, it is necessary to form both the negative electrode and the positive electrode on the side of the grown crystalline semiconductor layer.

In the case of the semiconductor device using the gallium nitride-based compound semiconductor, further, a sapphire substrate permits the emitted light waves to pass through. Therefore, attention has been given to a semiconductor device of the flip chip type that is mounted with the electrode surface on the lower side to allow light to leave from the side of the sapphire substrate.

FIG. 1 is a view which schematically illustrates the structure of a general light-emitting device of this type. The light-emitting device has a buffer layer 2, an n-type semiconductor layer 3, a light-emitting layer 4 and a p-type semiconductor layer 5 which are grown on a substrate 1, wherein the light-emitting layer 4 and the p-type semiconductor layer 5 are partly removed by etching so that the n-type semiconductor layer 3 is exposed. Besides, a positive electrode 10 is formed on the p-type semiconductor layer 5 and a negative electrode 20 is formed on the n-type semiconductor layer. The above light-emitting device is mounted with its electrode-forming surface facing, for example, a lead frame and is, thereafter, bonded thereto. Light emitted from the light-emitting layer 4 is taken out from the side of the substrate 1. To efficiently take out light from the light-emitting device of this type, the positive electrode 10 is made of a reflecting metal and is provided to cover most of the p-type semiconductor layer 5, so that light heading toward the positive electrode side from the light-emitting layer is reflected by the positive electrode 10 and leaves from the side of the substrate 1.

Therefore, the positive electrode material must have a small contact resistance and a high reflection factor. Ag and Al have generally been known as highly reflecting metals, and there has been proposed a reflecting positive electrode having a high reflecting factor formed by directly providing an Ag layer of a thickness of not smaller than 20 nm on the p-type semiconductor layer (see, for example, Japanese Unexamined Patent Publication No. 11-186599). As means for using Ag, Japanese Unexamined Patent Publication No. 11-186599 teaches a positive electrode obtained by forming a silver layer on a p-type nitride semiconductor layer and by over-coating the silver layer with a stabilizer layer. It has been described that the role of the stabilizer layer is to improve mechanical and electrical properties of the silver layer.

When the silver layer is over-coated with the stabilizer layer, the stabilizer layer is formed by using a material having a reflection factor lower than that of Ag or Al, as a matter of course. To achieve a high reflection factor of the positive electrode, the silver layer is designed to be as wide as possible, and the area where the stabilizer layer comes in contact with the p-type semiconductor layer is decreased to as small as possible. For this purpose, the stabilizer layer must be adhered to the p-type semiconductor layer while maintaining a large adhering strength.

As a technology for making the positive electrode metal film exfoliate less from the p-type semiconductor layer, there has been fabricated a gallium nitride semiconductor device having dents of a depth greater than a lattice constant (see, for example, Japanese Unexamined Patent Publication No. 2002-155507). According to this method, however, recessed portions must be formed in the step of growing the semiconductor, impairing the productivity.

DISCLOSURE OF THE INVENTION

It is an object of the present invention to provide a gallium nitride-based compound semiconductor light-emitting device having a positive electrode which comprises a first electrode and an over-coating layer covering the side surfaces and upper surface of the first electrode provided on a p-type semiconductor layer, the over-coating layer tending not to be exfoliated from the p-type semiconductor layer.

The semiconductor light-emitting device, in general, has a square shape, and the positive electrode has corner portions. Through keen study, the present inventors have discovered that the over-coating layer tends to exfoliate at the corner portions of the positive electrode, and have arrived at the present invention. Namely, the present application provides the following invention.

(1) A gallium nitride-based compound semiconductor light-emitting device comprising an n-type semiconductor layer, a light-emitting layer and a p-type semiconductor layer of gallium nitride-based compound semiconductors which are formed in this order on a substrate, the negative electrode and the positive electrode being provided in contact with the n-type semiconductor layer and the p-type semiconductor layer, respectively, wherein the positive electrode comprises at least a first electrode and an over-coating layer covering the side surfaces and upper surface of the first electrode, and the area where the over-coating layer comes into contact with the p-type semiconductor layer is greater at the corner portions of the positive electrode than at the side portions thereof, per unit length of the outer edge of the first electrode.

(2) The gallium nitride-based compound semiconductor light-emitting device according to (1) above wherein, when a gap between a side surface of the first electrode and a side surface of the over-coating layer on a side portion is denoted by A, a gap between the side surface of the first electrode and the side surface of the over-coating layer at corner portions is not smaller than $2^{1/2} \times A$.

(3) The gallium nitride-based compound semiconductor light-emitting device according to (1) or (2) above, wherein an angle of corner portions in a plane projected shape of the first electrode or of the over-coating layer is selected to be an obtuse angle, so that the area where the over-coating layer comes into contact with the p-type semiconductor layer becomes greater at the corner portions of the positive electrode than at the side portions thereof.

(4) The gallium nitride-based compound semiconductor light-emitting device according to (1) or (2) above, wherein corner portions in a plane projected shape of the first electrode or of the over-coating layer are formed in an arcuate shape, so that the area where the over-coating layer comes into contact with the p-type semiconductor layer becomes greater at the corner portions of the positive electrode than at the side portions thereof.

(5) The gallium nitride-based compound semiconductor light-emitting device according to any one of (1) to (4) above, wherein the gap between the side surface of the first electrode and the side surface of the over-coating layer is 0.1 to 50 μm.

(6) The gallium nitride-based compound semiconductor light-emitting device according to any one of (1) to (5) above, wherein the first electrode is a reflecting electrode.

(7) The gallium nitride-based compound semiconductor light-emitting device according to (6) above, wherein first electrode is a reflecting electrode containing Ag or Al.

(8) The gallium nitride-based compound semiconductor light-emitting device according to (6) or (7) above, wherein the over-coating layer is at least one kind of metal selected from the group consisting of Ti, V, Cr, Mn, Fe, Co, Ni, Zr, Nb, Mo, Tc, Ru, Rh, Pd, Hf, Ta, W, Re, Os, Ir, Pt and Au, or an alloy containing at least one kind of them.

(9) A lamp comprising the gallium nitride-based compound semiconductor light-emitting device of any one of (1) to (8) above.

In the gallium nitride-based compound semiconductor light-emitting device of the present invention, the positive electrode that includes the first electrode and the over-coating layer covering the side surfaces and upper surface of the first electrode, is provided on the p-type semiconductor layer. The positive electrode has such a pattern that the area where the over-coating layer comes in contact with the p-type semiconductor layer is greater at the corner portions of the positive electrode than at the side portions thereof, so that the over-coating layer is less likely to be exfoliated. Therefore, the gallium nitride-based compound semiconductor light-emitting device of the invention features fewer defectives at the time of production and an improved yield.

As the over-coating layer is less likely to be exfoliated, it is possible to decrease the contact area between the over-coating layer and the p-type semiconductor layer at portions (i.e., side portions) of the positive electrode other than the corner portions. It is, therefore, possible to increase the area of the first electrode and, hence, to achieve a high light-emission output and a low driving voltage.

BEST MODES FOR CARRYING OUT THE INVENTION

Figure 1:
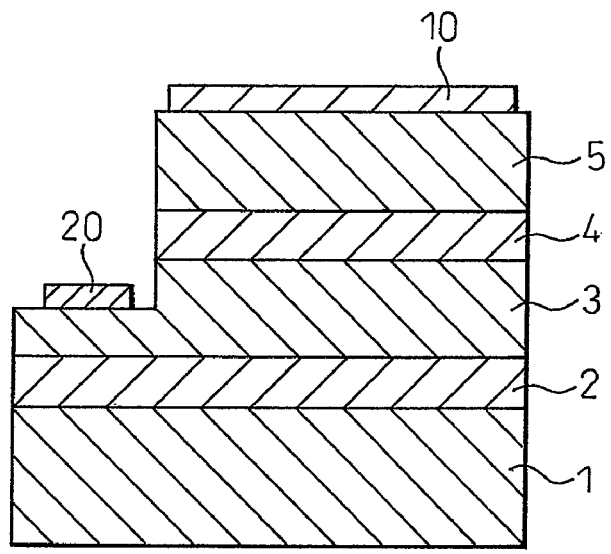
FIG. 1 is a schematic view illustrating a general structure of a conventional flip chip type compound semiconductor light-emitting device.

As the gallium nitride-based compound semiconductor stacked on a substrate of the present invention, there can be used without any limitation a widely known one obtained by growing a buffer layer 2, an n-type semiconductor layer 3, a light-emitting layer 4 and a p-type semiconductor layer 5 on a substrate 1 as shown in FIG. 1. As the substrate, there can be used any known one such as sapphire or SiC without any limitation. There have been known many gallium nitride-based compound semiconductors where the compound is expressed by the formula $Al_xIn_yGa_{1-x-y}N$ ($0 \leq x < 1$, $0 \leq y < 1$, $x+y<1$). In the present invention, too, there can be used gallium nitride-based compounds expressed by the general formula $Al_xIn_yGa_{1-x-y}N$ ($0 \leq x<1$, $0 \leq y<1$, $x+y<1$) without any limitation. There have also been known many n-type semiconductor layers, light-emitting layers and p-type semiconductors having various kinds of compositions and structures. In the present invention, too, the above known layers can be used without any limitation.

Figure 2:
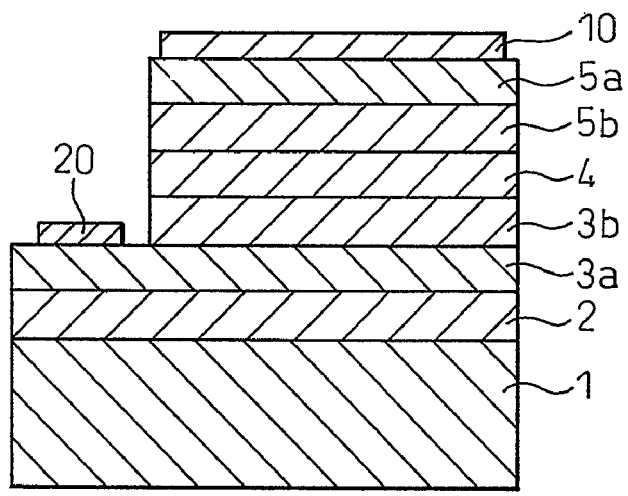
FIG. 2 is a schematic view in cross section of a gallium nitride-based compound semiconductor light-emitting device fabricated in Examples 1 and 2.

For instance, there can be used the stacked structure shown in FIG. 2 that is obtained by successively stacking, on a sapphire substrate 1, a buffer layer 2 which is an AlN layer, an n-contact layer 3a which is an n-type GaN layer, an n-clad layer 3b which is an n-type GaN layer, a light-emitting layer 4 which is an InGaN layer, a p-clad layer 5b which is a p-type AlGaN layer, and a p-contact layer 5a which is a p-type GaN layer.

The p-contact layer 5a, p-clad layer 5b, light-emitting layer 4 and n-clad layer 3b of the gallium nitride-based compound semiconductor are partly removed by etching, and a negative electrode 20 of, for example, Ti/Au is formed on the n-contact layer 3a, and a positive electrode 10 is formed on the p-contact layer 5a.

In the present invention, the positive electrode 10 includes a first electrode and an over-coating layer covering the side surfaces and upper surface of the first electrode. Further, a bonding pad layer is provided on the over-coating layer for electric connection to the circuit board or to the lead frame.

Figure 5:
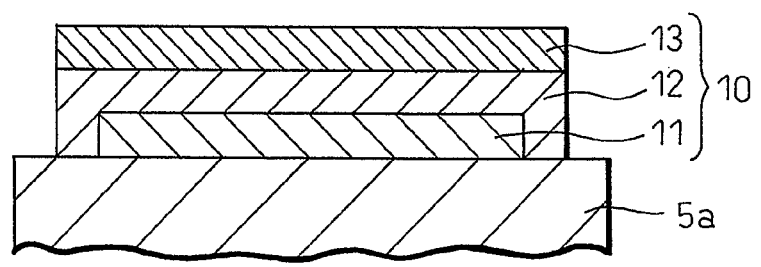
FIG. 5 is a schematic view illustrating, in cross section, a positive electrode structure of the present invention.

FIG. 5 is a sectional view of the positive electrode (10) of the invention. When the over-coating layer (12) is electrically conducting, a bonding pad layer (13) is provided on the over-coating layer. An electric current flows from the bonding pad layer (13) to the first electrode (11) through the over-coating layer (12).

Figure 6:
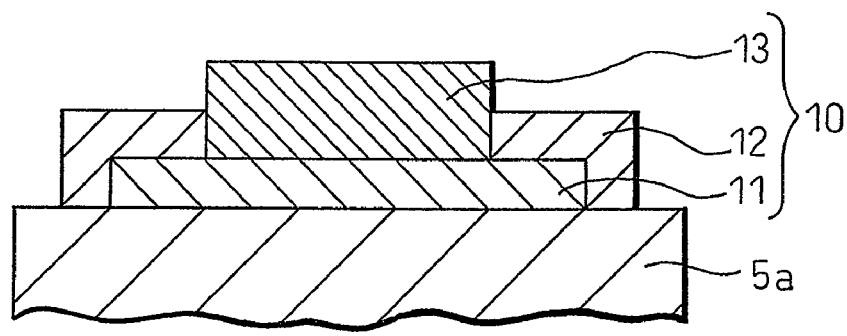
FIG. 6 is a schematic view illustrating, in cross section, the positive electrode structure according to another embodiment of the present invention.

FIG. 6 is a sectional view illustrating another positive electrode (10) of the present invention. When the over-coating layer (12) is non-conducting, no over-coating layer is present on part of the first electrode (11), and the bonding pad layer (13) is directly provided on the first electrode (11) at that position. The electric current flows from the bonding pad (13) directly into the first electrode (11).

The first electrode is provided in contact with the p-contact layer. As the positive electrode of the gallium nitride-based compound semiconductor light-emitting device, there have been known light-transmitting electrodes and reflecting electrodes of various compositions and structures. As the first electrode of the present invention, there can be used light-transmitting electrodes and reflecting electrodes of various compositions and structures inclusive of the above known light-transmitting electrodes and reflecting electrodes.

The light-transmitting positive electrode material may contain Pt, Pd, Au, Cr, Ni, Cu or Co. It has further been known to improve the light-transmitting property by oxidizing part of these materials. As the reflecting positive electrode material, there can be used Rh, Ag or Al in addition to the above material.

It has been known that the reflecting electrode uses Ag or Al having a high reflection factor as a reflecting layer. There takes place a phenomenon called electromigration in which Ag and Al are ionized in the presence of water and are diffused. Therefore, the electrode using Ag or Al forms a precipitate comprising chiefly Ag or Al when an electric current flows in an atmosphere where water is present in the surroundings. When the precipitate generated at the positive electrode arrives at the negative electrode, the electric current flowing into the device ceases to flow through the light-emitting layer and no light is emitted from the device. Besides, no light is emitted if the precipitate connects the p-type semiconductor layer to the n-type semiconductor layer.

To prevent this, it is desired that the over-coating layer is provided so as to cover the side surfaces and upper surface of the reflecting layer. The over-coating layer plays the role of preventing Ag or Al in the reflection layer from coming in contact with moisture in the air. As described above, the present invention becomes particularly effective when the first electrode is a reflecting electrode using Ag or Al.

The over-coating layer is so provided as to cover the first electrode and is inevitably brought into contact with the p-type semiconductor layer over a decreased contact area. Therefore, the over-coating layer as a whole is adhered to the p-type semiconductor layer with a decreased adhering strength. Further, when the positive electrode has corner portions in the structure in which the over-coating layer covers the first electrode, exfoliation tends to occur at the portions covering the corners.

Figure 3:
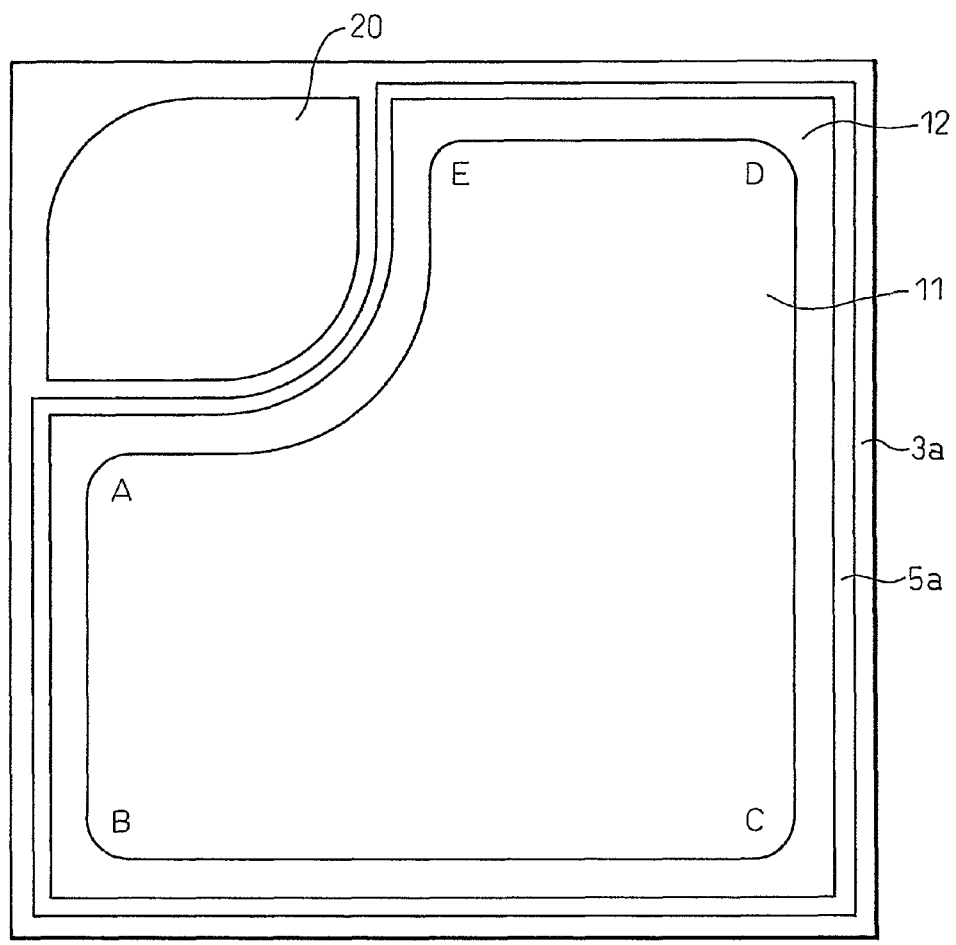
FIG. 3 is a schematic view illustrating, on a plane, the gallium nitride-based compound semiconductor light-emitting device fabricated in Example 1.
Figure 4:
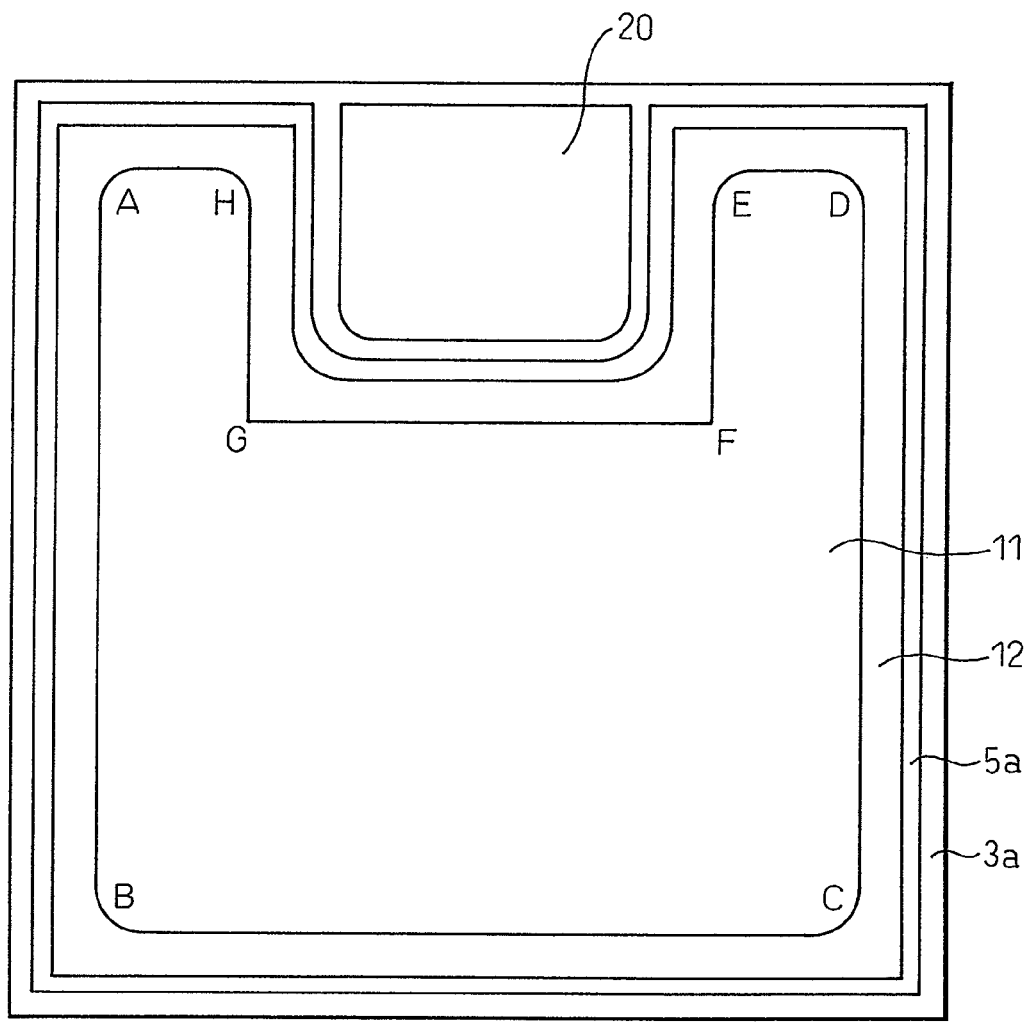
FIG. 4 is a schematic view illustrating, on a plane, the gallium nitride-based compound semiconductor light-emitting device fabricated in Example 2.

In this invention, the "corner portions" of the positive electrode stand for portions where two straight lines of different directions meet at the outer edges of the positive electrode, and straight portions other than the corner portions are called "side portions". FIG. 3 is a schematic view illustrating, on a plane, the gallium nitride-based compound semiconductor light-emitting device fabricated in Example 1, wherein A to E denote corner portions. FIG. 4 is a schematic view illustrating, on a plane, the gallium nitride-based compound semiconductor light-emitting device fabricated in Example 2, wherein A to H denote corner portions.

The area where the over-coating layer comes in contact with the p-type semiconductor layer is increased at the corner portions of the positive electrode to be greater than that at the side portions thereof, so that the over-coating layer becomes less likely to exfoliate. The contact areas at the corner portions and at the side portions are compared on the basis of average values per unit length.

Figure 7:
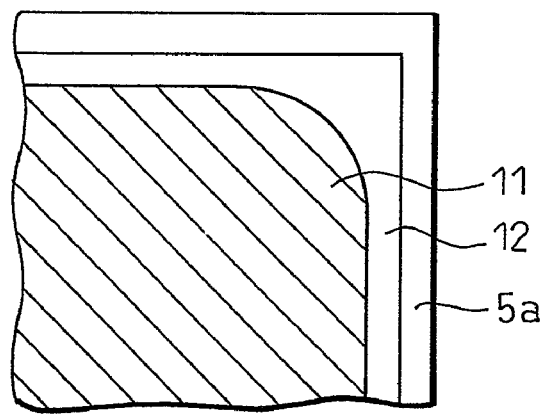
FIG. 7 is a view illustrating a pattern in which the area where an over-coating layer is contacting a p-type semiconductor layer is greater at a corner portion of the positive electrode than at a side portion thereof.
Figure 8:
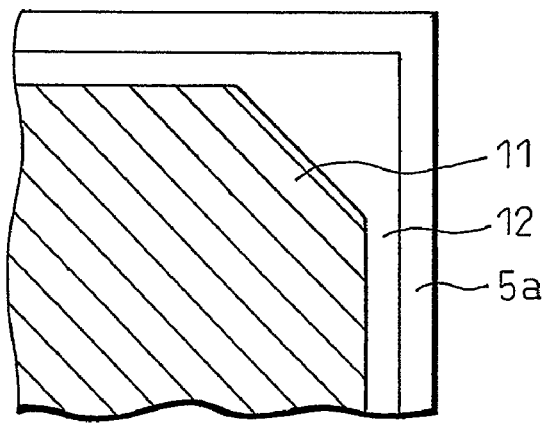
FIG. 8 is a view illustrating another pattern in which the area where the over-coating layer is contacting the p-type semiconductor layer is greater at the corner portion of the positive electrode than at the side portion thereof.
Figure 9:
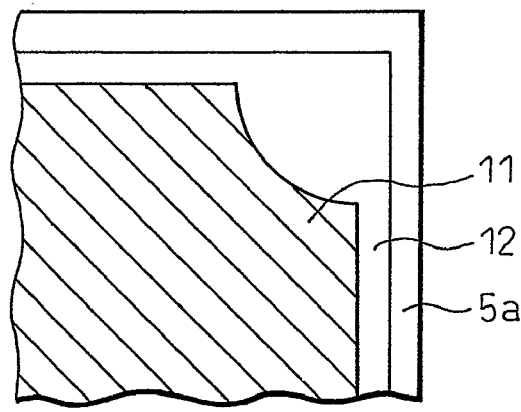
FIG. 9 is a view illustrating another pattern in which the area where the over-coating layer is contacting the p-type semiconductor layer is greater at the corner portion of the positive electrode than at the side portion thereof.
Figure 10:
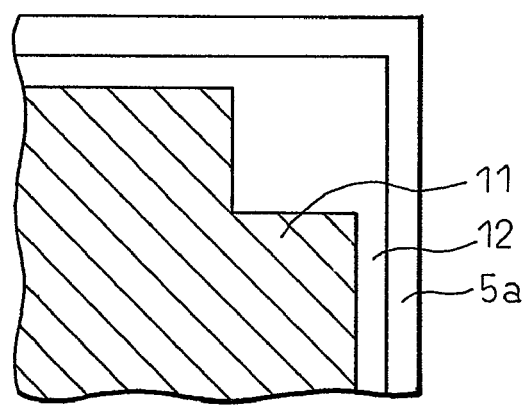
FIG. 10 is a view illustrating another pattern in which the area where the over-coating layer is contacting the p-type semiconductor layer is greater at the corner portion of the positive electrode than at the side portion thereof.
Figure 11:
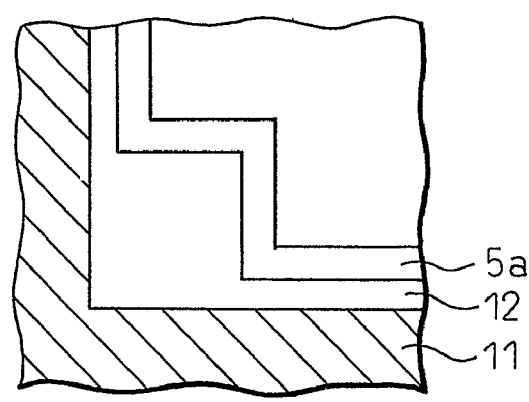
FIG. 11 is a view illustrating another pattern in which the area where the over-coating layer is contacting the p-type semiconductor layer is greater at the corner portion of the positive electrode than at the side portion thereof.
Figure 12:
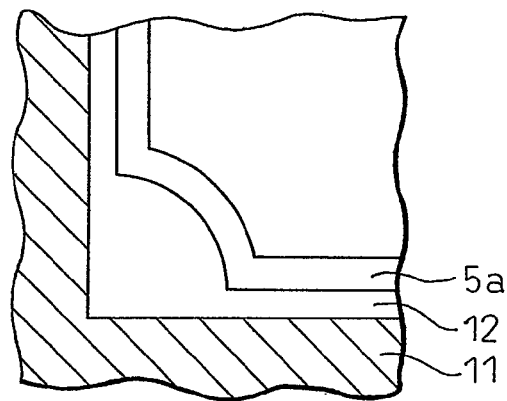
FIG. 12 is a view illustrating another pattern in which the area where the over-coating layer is contacting the p-type semiconductor layer is greater at the corner portion of the positive electrode than at the side portion thereof.

For example, by forming the corner portions of the positive electrode in patterns as shown in FIGS. 7 to 16, it is possible to increase the areas where the over-coating layer comes in contact with the p-type semiconductor layer. FIGS. 7 to 10 illustrate the cases where an angle occupied by the first electrode at the corner portions is not larger than 180° (A to E in FIG. 3, and A to E and H in FIG. 4). In this case as shown in FIG. 7, the corner portion of the first electrode may be formed in an arcuate shape. As shown in FIG. 8, further, the angle of the first electrode at the corner portion may be an obtuse angle which is greater than the angle of the over-coating layer. Further, the first electrode at the corner portions may be formed in the shapes shown in FIGS. 9 and 10.

Figure 13:
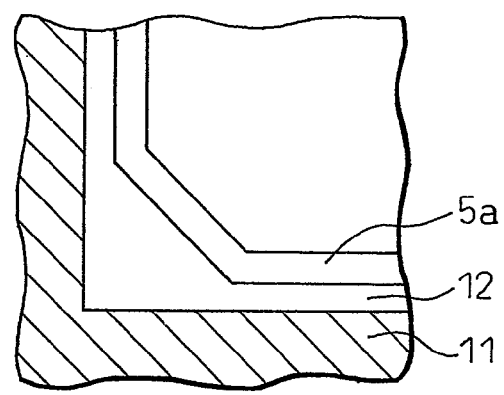
FIG. 13 is a view illustrating another pattern in which the area where the over-coating layer is contacting the p-type semiconductor layer is greater at the corner portion of the positive electrode than at the side portion thereof.
Figure 14:
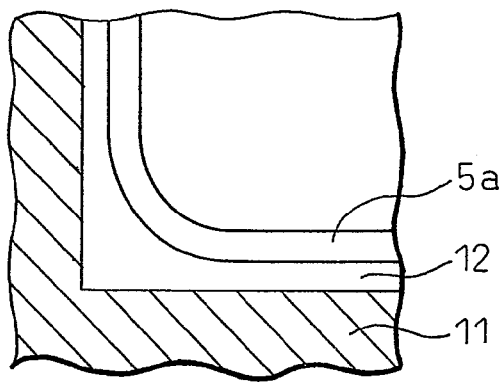
FIG. 14 is a view illustrating another pattern in which the area where the over-coating layer is contacting the p-type semiconductor layer is increased at the corner portion of the positive electrode to be greater than that at the side portion thereof.
Figure 15:
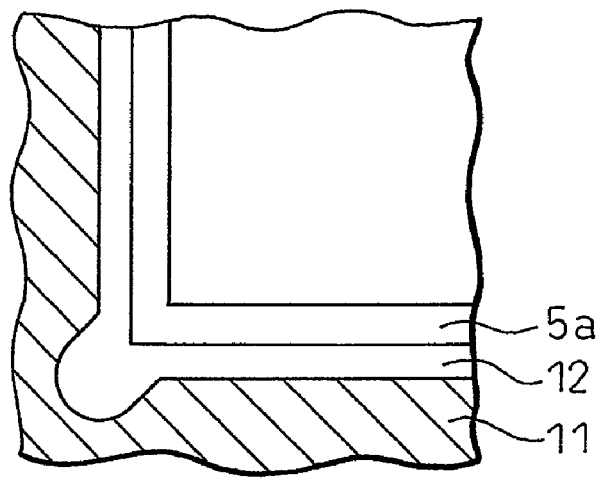
FIG. 15 is a view illustrating another pattern in which the area where the over-coating layer is contacting the p-type semiconductor layer is greater at the corner portion of the positive electrode than at the side portion thereof.
Figure 16:
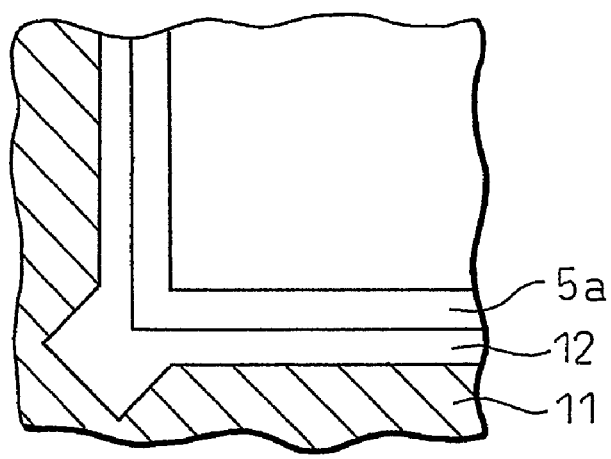
FIG. 16 is a view illustrating another pattern in which the area where the over-coating layer is contacting the p-type semiconductor layer is greater at the corner portion of the positive electrode than at the side portion thereof.

FIGS. 11 to 16 illustrate the cases where an angle occupied by the first electrode at the corner portions is not smaller than 180° (F and G in FIG. 4). In this case, as shown in FIG. 14, the corner portion of the over-coating layer may be formed in an arcuate shape. As shown in FIG. 13, further, the angle of the over-coating layer at the corner portions as measured from the side of the first electrode may be an obtuse angle which is greater than the angle possessed by the first electrode. Further, the over-coating layer or the first electrode at the corner portions may be formed in the shapes shown in FIGS. 11, 12, 15 and 16.

If the corner portions of the first electrode or of the over-coating layer have shapes as described above, when the gap between the side surface of the first electrode and the side surface of the over-coating layer in the side portion is denoted by A, it is desired that the gap between the side surface of the first electrode and the side surface of the over-coating layer in the corner portion is not smaller than $2^{1/2} \times A$ from the standpoint of preventing exfoliation of the over-coating layer.

There is no particular limitation on the material of the over-coating layer provided it is capable of forming a thin layer to cover the side surfaces and upper surface of the first electrode, and there can be used a metal, an inorganic oxide, an inorganic nitride or a resin. Here, when the first electrode transmits light, the over-coating layer transmits light, too, as a matter of course. When a non-conducting material is used, a window portion must be formed in the over-coating layer and a bonding pad layer must be formed therein. Therefore, an electrically conducting material is preferred.

When the positive electrode has a first electrode with a reflecting property, it is desired that the material of the over-coating layer is at least one kind of metal selected from the group consisting of Ti, V, Cr, Mn, Fe, Co, Ni, Zr, Nb, Mo, Tc, Ru, Rh, Pd, Hf, Ta, W, Re, Os, Ir, Pt and Au, or an alloy containing at least one kind of them. It is desired that these metals and alloys are electrically conducting even from the standpoint of preventing electromigration of Ag or Al. It is not desired to use metals (alkali metals, alkaline earth metals) that are subjected to be corroded or low-melting-point metals (400° C. or lower). Au that is suited as a material of the bonding pad layer may be used as the over-coating layer, so that the over-coating layer also works as the bonding pad layer.

It is desired that the over-coating layer covers the first electrode, and is in ohmic contact with the p-type semiconductor along the outer peripheral portion thereof. Upon coming into ohmic contact, even a light-emitting layer just under the over-coating layer emits light. Further, the forward voltage can be lowered for the device as a whole. As a metal for easily accomplishing the ohmic contact, it is desired to use a metal of the platinum group such as Ru, Rh, Pd, Os, Ir or Pt, or an alloy containing at least one kind of metal of the platinum group. It is desired that the contact resistivity is not greater than $1 \times 10^{-3}$ $\Omega$-cm$^2$. The contact resistivity is measured by the TLM method.

When the first electrode is the reflecting positive electrode having the reflecting layer of Ag or Al, the gap between the side surface of the first electrode and the side surface of the over-coating layer must be such that the first electrode is separated away from the external moisture and is, desirably, not smaller than 0.1 µm. More desirably, the gap is not smaller than 1 µm for sufficient separation from the external moisture under high temperature and high humidity conditions. An increase in the gap results in a decrease in the area of the first electrode. It is, therefore, desired that the gap is not greater than 50 µm. More desirably, the gap is not greater than 20 µm. Further, the over-coating layer must not be of such a structure that contains fine tubular pores that permit water to infiltrate into it.

As for the bonding pad layer 13, a variety of structures using such materials as Au, Al, Ni and Cu has been known. The bonding pad layer of these known materials and structures can be used without any limitation in the present invention. The thickness is, desirably, 100 to 1000 nm. Since the bondability increases with an increase in the thickness, from the standpoint of properties of the bonding pad it is desired that the thickness is not smaller than 300 nm. From the standpoint of production cost, further, it is desired that the thickness is not greater than 500 nm.

The first electrode, over-coating layer and bonding pad layer can be formed by a widely known thin film-forming technology such as sputtering, vacuum evaporation or solution coating method. When the above metals are used, in particular, it is desired that sputtering or vacuum evaporation is employed.

As for the negative electrode 20, there have been known negative electrodes of various compositions and structures, and these known negative electrodes can be used without any limitation. As the contact materials for the negative electrode that comes in contact with the n-contact layer, there can be used Al, Ti, Ni, Au as well as Cr, W and V. It need not be pointed out that the negative electrode as a whole may be formed as a multi-layer structure to impart a bonding property and the like properties.

EXAMPLES

The invention will be described in further detail with reference to Examples and Comparative Examples to which the invention is in no way limited.

Example 1

FIG. 2 is a schematic view in cross section of a gallium nitride-based compound semiconductor light-emitting device fabricated in this Example. FIG. 3 is a plan view thereof.

The gallium nitride-based compound semiconductor is obtained by successively stacking, on a sapphire substrate 1, a buffer layer 2 which is an AlN layer, an n-contact layer 3a which is an n-type GaN layer, an n-clad layer 3b which is an n-type GaN layer, a light-emitting layer 4 which is an InGaN layer, a p-clad layer 5b which is a p-type AlGaN layer, and a p-contact layer 5a which is a p-type GaN layer. The n-contact layer 3a is an n-type Gan layer doped with Si at $7 \times 10^{18}$/cm$^3$, the n-clad layer 3b is an n-type GaN layer doped with Si at $5 \times 10^{18}$/cm$^3$, and the light-emitting layer 4 is of a single quantum well structure of InGaN of a composition In$_{0.95}$Ga$_{0.05}$N. The p-clad layer 5b is a p-type AlGaN doped with Mg at $1 \times 10^{18}$/cm$^3$ and has a composition Al$_{0.25}$Ga$_{0.75}$N. The p-contact layer 5a is a p-type GaN layer doped with Mg at $5 \times 10^{19}$/cm$^3$. These layers were stacked by the MOCVD method under ordinary conditions which have been well known in the field of this technology.

A flip chip type gallium nitride-based compound semiconductor light-emitting device was fabricated by providing the positive electrode 10 and the negative electrode 20 on the gallium nitride-based compound semiconductor stacked structure according to a procedure described below.

(1) First, the n-contact layer 3a was exposed on the negative electrode-forming region of the gallium nitride-based compound semiconductor stacked structure. The procedure was as described below. An etching mask was formed on a region other than the negative electrode-forming region on the p-contact layer 5a relying on the known lithography technology and the lift-off technology.

Next, the etching was effected by the reactive ion dry etching until the n-contact layer 3a was exposed. Thereafter, the stacked structure was taken out from the dry etching device, and the etching mask was removed by washing with acetone.

(2) Next, the positive electrode 10 was formed by the following procedure. The first electrode 11 was a reflecting electrode constituted by a contact metal layer of Pt having a thickness of 4 nm and a reflecting layer of Ag having a thickness of 200 nm. In order to remove the oxide film on the surface of the p-contact layer 5a, the stacked structure was treated in boiling concentrated HCl for 10 minutes and, thereafter, a positive electrode was formed on the p-contact layer 5a. First, there was formed a first electrode comprising a contact metal layer and a reflecting layer. The forming procedure was as described below.

The resist was uniformly applied. Relying on a known lithography technology, the resist was removed from a region where the first electrode was to be formed. The corner portions of the first electrode were formed in an arcuate pattern (FIG. 3). R of the corner portions was 30 μm. After immersed in the buffered hydrofluoric acid (BHF) at room temperature for one minute, the first electrode was formed by using a vacuum sputtering apparatus. The operation conditions for formation by the sputtering method were as described below.

The interior of the chamber was evacuated until the vacuum degree was $10^{-4}$ Pa or less, the gallium nitride-based compound semiconductor stacked structure was contained in the chamber, and an Ar gas was introduced as a sputtering gas into the chamber so as to reach a pressure of 3 Pa. Thereafter, sputtering was conducted by RF discharge to form a contact metal layer. The electric power that was supplied was 0.5 kW, and Pt was deposited in a thickness of 4.0 nm to form the contact metal layer.

Next, the Ag reflecting layer was formed maintaining a thickness of 200 nm by the DC discharge sputtering under the conditions of the above pressure and electric power. After being taken out from the sputtering apparatus, the metal film was removed together with the resist from the regions other than the region of the first electrode relying on the lift-off technology.

Next, the over-coating layer 12 was formed. After the resist was uniformly applied, a region of the over-coating layer wider than the region of the first electrode was opened as a window relying upon a known lithography technology. The size of the window was such that the gap was 10 μm between the side surface of the first electrode and the side surface of the over-coating layer. Au was formed in a thickness of 400 nm by DC discharge sputtering. After being taken out from the sputtering apparatus, the metal film was removed together with the resist from the regions other than the region of the over-coating layer by the lift-off technology. The over-coating layer also works as the bonding pad layer.

(3) The negative electrode 20 was formed on the n-contact layer 3a. The forming procedure was as described below. After the resist was uniformly applied on the whole surface, a window for the negative electrode region was opened on a region exposed up to the n-contact layer 3a by a known lithography technology, and Ti and Au were formed in thicknesses of 100 nm and 300 nm, respectively, by the vacuum evaporation method. The metal film was removed together with the resist from the regions other than the negative electrode portion.

(4) A protection film was formed. The forming procedure was as described below. After the resist was uniformly applied on the whole surface, a window was opened in a portion between the positive electrode and the negative electrode by the known lithography technology, and $SiO_2$ was formed in a thickness of 200 nm by the RF discharge sputtering method. The $SiO_2$ film was removed together with the resist from the regions other than the portion of the protection film.

(5) The wafer was divided to obtain gallium nitride-based compound semiconductor light-emitting devices of the invention.

The obtained light-emitting devices were observed by eye. As a result, no exfoliation of the over-coating layer was observed at portions inclusive of corner portions of the over-coating layer. The obtained light-emitting devices were evaluated for their driving voltages and outputs to find that the driving voltage was 3.3 V with a current of 20 mA and the output was 8.5 mW.

Example 2

A gallium nitride-based compound semiconductor light-emitting device was fabricated by the same method as that of Example 1 with the exception of forming the electrode in a plane shape as shown in FIG. 4. The gap between the side surface of the first electrode 11 and the side surface of the over-coating layer 12 was selected to be 10 μm like in Example 1. The first electrode was formed in an arcuate shape at corner portions A to E and H of the positive electrode while the over-coating layer was formed in an arcuate shape at corner portions F and G. R was 30 μm as in Example 1.

The obtained light-emitting devices were observed by eye. As a result, no exfoliation of the over-coating layer was observed at portions inclusive of corner portions of the over-coating layer. The obtained light-emitting devices were evaluated for their driving voltages and outputs to find that the driving voltage was 3.4 V with a current of 20 mA and the output was 8 mW.

Comparative Example

A gallium nitride-based compound semiconductor light-emitting device was fabricated by the same method as that of Example 1 without, however, forming the corner portions of the first electrode in an arcuate shape but, instead, permitting the sides to extent to meet at right angles. The obtained light-emitting devices were observed by eye. As a result, exfoliation of the over-coating layer was observed at portions inclusive of corner portions of the over-coating layer. The percentage defective was 10 to 80%.

INDUSTRIAL APPLICABILITY

The gallium nitride-based compound semiconductor light-emitting device of the present invention is obtained in a high yield featuring a low driving voltage and a high light-emitting output, and offers a very great industrial value as a material for producing lamps and the like.

The invention claimed is:

1. A gallium nitride-based compound semiconductor light-emitting device comprising an n-type semiconductor layer, a light-emitting layer and a p-type semiconductor layer of gallium nitride-based compound semiconductors which are formed in this order on a substrate, a negative electrode and a positive electrode being provided in contact with the n-type semiconductor layer and the p-type semiconductor layer, respectively, wherein the positive electrode comprises at least a first electrode having a side surface and an over-coating layer having a side surface and covering side surfaces and an upper surface of the first electrode, and an area where the over-coating layer comes into contact with the p-type semiconductor layer is greater at corner portions of the positive electrode than at side portions thereof, per unit length of an outer edge of the first electrode, wherein an angle of corner portions in a plane projected shape of the first electrode or of the over-coating layer is selected to be an obtuse angle, or corner portions in a plane projected shape of the first electrode or of the over-coating layer are formed in an arcuate shape, so that the area where the over-coating layer comes into contact with the p-type semiconductor layer becomes greater at the corner portions of the positive electrode than at the side portions thereof.

2. The gallium nitride-based compound semiconductor light-emitting device according to claim 1, wherein when a gap between a side surface of the first electrode and a side surface of the over-coating layer on a side portion is denoted by A, a gap between a side surface of the first electrode and a side surface of the over-coating layer at corner portions is not smaller than $2^{1/2} \times A$.

3. The gallium nitride-based compound semiconductor light-emitting device according to claim 1, wherein a gap between the side surface of the first electrode and the side surface of the over-coating layer is 0.1 to 50 μm.

4. The gallium nitride-based compound semiconductor light-emitting device according to claim 1, wherein the first electrode is a reflecting electrode.

5. The gallium nitride-based compound semiconductor light-emitting device according to claim 4, wherein the first electrode is a reflecting electrode containing Ag or Al.

6. The gallium nitride-based compound semiconductor light-emitting device according to claim 4, wherein the over-coating layer is at least one of metal selected from the group consisting of Ti, V, Cr, Mn, Fe, Co, Ni, Zr, Nb, Mo, Tc, Ru, Rh, Pd, Hf, Ta, W, Re, Os, Ir, Pt and Au, or an alloy thereof.

7. A lamp comprising the gallium nitride-based compound semiconductor light-emitting device according to claim 1.

* * * * *